(12) United States Patent
Chung et al.

(10) Patent No.: US 10,049,882 B1
(45) Date of Patent: Aug. 14, 2018

(54) METHOD FOR FABRICATING SEMICONDUCTOR DEVICE INCLUDING FORMING A DIELECTRIC LAYER ON A STRUCTURE HAVING A HEIGHT DIFFERENCE USING ALD

(71) Applicant: SAMSUNG ELECTRONICS CO., LTD., Suwon-si, Gyeonggi-do (KR)

(72) Inventors: Won Woong Chung, Suwon-si (KR); Sun hye Hwang, Hwaseong-si (KR); Youn Joung Cho, Hwaseong-si (KR); Jung Sik Choi, Seongnam-si (KR); Xiaobing Zhou, Midland, MI (US); Brian David Rekken, Midland, MI (US); Byung Keun Hwang, Midland, MI (US); Michael David Telgenhoff, Midland, MI (US)

(73) Assignees: SAMSUNG ELECTRONICS CO., LTD., Suwon-si, Gyeonggi-do (KR); DOW SILICONES CORPORATION, Midland, MI (US)

( * ) Notice: Subject to any disclaimer, the term of this patent is extended or adjusted under 35 U.S.C. 154(b) by 0 days.

(21) Appl. No.: 15/414,913

(22) Filed: Jan. 25, 2017

(51) Int. Cl.
*H01L 21/28* (2006.01)
*H01L 21/02* (2006.01)

(52) U.S. Cl.
CPC .... *H01L 21/28282* (2013.01); *H01L 21/0217* (2013.01); *H01L 21/0228* (2013.01); *H01L 21/02164* (2013.01); *H01L 21/02211* (2013.01)

(58) Field of Classification Search
None
See application file for complete search history.

(56) References Cited

U.S. PATENT DOCUMENTS

| 9,117,664 | B2 | 8/2015 | Zhou | |
|---|---|---|---|---|
| 2008/0026149 | A1 | 1/2008 | Tomasini et al. | |
| 2013/0175369 | A1* | 7/2013 | Park | B05B 1/3046 |
| | | | | 239/583 |
| 2014/0141542 | A1* | 5/2014 | Kang | C23C 16/345 |
| | | | | 438/14 |
| 2015/0024608 | A1 | 1/2015 | Mayorga et al. | |
| 2015/0147871 | A1 | 5/2015 | Xiao et al. | |
| 2015/0166576 | A1 | 6/2015 | Dussarrat et al. | |
| 2015/0221513 | A1 | 8/2015 | Majima et al. | |
| 2015/0249007 | A1 | 9/2015 | Xiao et al. | |
| 2015/0303060 | A1 | 10/2015 | Cho et al. | |

(Continued)

FOREIGN PATENT DOCUMENTS

JP          10-287413 A     10/1998

*Primary Examiner* — Bilkis Jahan
(74) *Attorney, Agent, or Firm* — Lee & Morse, P.C.

(57) ABSTRACT

A method for fabricating a semiconductor device includes forming a structure with a height difference on a substrate and forming a dielectric layer structure on the structure using an atomic layer deposition (ALD) method. Forming the dielectric layer structure includes forming a first dielectric layer including silicon nitride on the structure with the height difference. Forming the first dielectric layer includes feeding a first gas including pentachlorodisilane (PCDS) or diisopropylamine pentachlorodisilane (DPDC) as a silicon precursor, and a second gas including nitrogen components into a chamber including the substrate such that the first dielectric layer is formed in situ on the structure having the height difference.

20 Claims, 14 Drawing Sheets

(56) References Cited

U.S. PATENT DOCUMENTS

2015/0376211 A1  12/2015  Girard et al.
2016/0111272 A1* 4/2016  Girard ................ H01L 21/0228
                                              438/770

* cited by examiner

METHOD FOR FABRICATING SEMICONDUCTOR DEVICE INCLUDING FORMING A DIELECTRIC LAYER ON A STRUCTURE HAVING A HEIGHT DIFFERENCE USING ALD

BACKGROUND

Exemplary embodiments relate to a method for fabricating a semiconductor device. Exemplary embodiments relate to forming thin films on substrates having a step coverage.

SUMMARY

Embodiments are directed to a method for fabricating a semiconductor device, including forming a structure with a height difference on a substrate and forming a dielectric layer structure on the structure using an atomic layer deposition (ALD) method. Forming the dielectric layer structure includes forming a first dielectric layer including silicon nitride on the structure with the height difference. Forming the first dielectric layer includes feeding a first gas including pentachlorodisilane (PCDS) or diisopropylamine pentachlorodisilane (DPDC) as a silicon precursor, and a second gas including nitrogen components into a chamber including the substrate such that the first dielectric layer is formed in situ on the structure having the height difference.

Embodiments are also directed to a method for fabricating a semiconductor device, including forming a structure on a substrate, and forming a silicon nitride layer on the structure inside a chamber using an atomic layer deposition (ALD) method. Forming the silicon nitride layer may include feeding a first gas including one of pentachlorodisilane (PCDS) and diisopropylaminopentachlorodisilane (DPDC) as a silicon precursor into the chamber, purging an unreacted portion of the first gas by feeding a first purge gas into the chamber, feeding a second gas including a nitrogen gas into the chamber, and purging an unreacted portion of the second gas by feeding a second purge gas into the chamber.

Embodiments are also directed to a method of forming a dielectric layer on a target object by atomic layer deposition, the target object including at least one structural feature having a sidewall including feeding a first gas including pentachlorodisilane (PCDS) or diisopropylamine pentachlorodisilane (DPDC) into a chamber including the target object to form a silicon precursor layer having an atomic layer thickness on the target object, feeding a first purge gas into the chamber to purge an unreacted or unadsorbed portion of the first gas from the chamber, feeding a second gas into the chamber, the second gas being nitrogen or a nitrogen compound containing gas, such that the second gas reacts with the silicon precursor to form a silicon nitride layer having an atomic layer thickness on the target object, feeding a second purge gas into the chamber to purge an unreacted or unadsorbed portion of the second gas from the chamber, and repeating feeding the first gas, feeding the first purge gas, feeding the second gas and feeding the second purge gas to form the dielectric layer to include a silicon nitride layer having greater than an atomic layer thickness.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
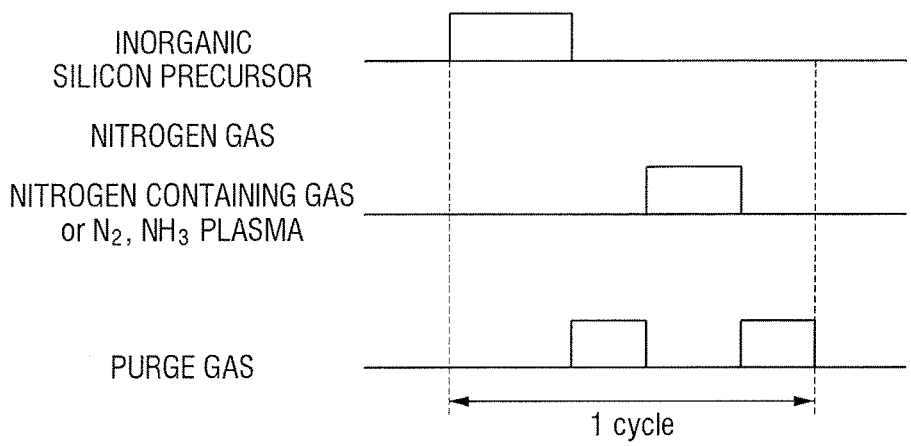
FIG. 1 illustrates a timing diagram showing the formation of a silicon nitride layer according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

The formation of a silicon nitride layer according to some exemplary embodiments will hereinafter be described with reference to FIG. 1.

FIG. 1 illustrates a timing diagram showing the formation of a silicon nitride layer according to some exemplary embodiments.

A silicon nitride layer may be formed in situ using an atomic layer deposition (ALD) method according to the present disclosure. The ALD method may include feeding a first gas including a silicon precursor, purging an unreacted portion of the first gas using a first purge gas, forming a silicon nitride layer having an atomic-layer thickness by feeding a second gas comprising a nitride gas, and purging an unreacted portion of the second gas using a second purge gas.

For example, referring to FIG. 1, a target object (for example, a structure formed on a substrate) on which to form a silicon nitride layer may be placed inside a chamber. The height-to-width ratio, i.e., the aspect ratio, of the target object may be, for example, 10 or greater.

Thereafter, the temperature and pressure may be adjusted, and a first gas including a silicon precursor may be fed into the chamber. Then, the silicon precursor is adsorbed onto the target object.

The silicon precursor, unlike a typical organic silicon precursor comprising carbon (C) and nitrogen (N) components, may be a compound not including any C and N components. In some implementations, the silicon precursor may include C components.

The silicon precursor may be or include, for example, pentachlorodisilane (PCDS) represented by Formula 1 or diisopropylamino pentachlorodisilane (DPDC) represented by Formula 2:

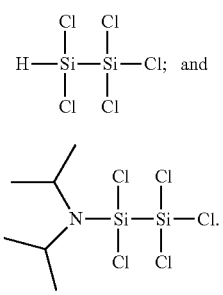

<Formula 1>

<Formula 2>

When PCDS or DPDC is used as the silicon precursor, the surface reactivity of the silicon precursor may be improved, and thus, a growth per cycle (GPC) rate may be enhanced, compared to a case in which hexachlorodisilane (HCDS) or dichlorosilane (DCS) is used as the silicon precursor.

Thereafter, a portion of the silicon precursor that remains unreacted in the chamber may be purged by feeding a first purge gas such as, for example, a nitrogen ($N_2$) gas, a helium (He) gas, or an argon (Ar) gas, into the chamber. As a result, the silicon precursor adsorbed onto the target object may be transformed into a layer having an atomic-layer thickness.

Thereafter, a silicon nitride layer may be formed by feeding a nitride gas comprising N components into the chamber. The nitride gas may include at least one of a $N_2$, ammonia ($NH_3$), and nitrogen monoxide (NO), as examples.

Thereafter, a portion of the nitride gas that remains unreacted in the chamber may be purged by feeding a second purge gas such as, for example, a $N_2$, He, or Ar gas, into the chamber. In this manner, one cycle of the formation of a silicon nitride layer may be completed, and a silicon nitride layer having an atomic-layer thickness may be formed on the target object.

By repeatedly performing the forming of the silicon nitride layer having an atomic-layer thickness, a silicon nitride layer having a desired thickness can be formed on the target object.

The silicon nitride layer may be subjected to a thermal treatment process to improve the quality of the silicon nitride layer. The thermal treatment process may be performed at deposition temperature that is as high as a temperature used for forming a silicon nitride layer by chemical vapor deposition (CVD). For example, the thermal treatment process may be performed at a deposition temperature of about 850° C. to about 1,050° C.

The quality of the silicon nitride layer obtained by the ALD method may be superior to the quality of a silicon nitride layer obtained by, for example, CVD. The silicon nitride layer obtained by the ALD method described herein may have an excellent step coverage and thus may be conformally formed on a structure with a large height difference or a high aspect ratio without leaving any voids.

The following examples and comparative examples are provided in order to highlight characteristics of one or more embodiments, but it will be understood that the examples and comparative examples are not to be construed as limiting the scope of the embodiments, nor are the comparative examples to be construed as being outside the scope of the embodiments. Further, it will be understood that the embodiments are not limited to the particular details described in the examples and comparative examples.

An experimental example of the formation of a silicon nitride layer according to some exemplary embodiments will hereinafter be described with reference to FIG. 2.

Figure 2:
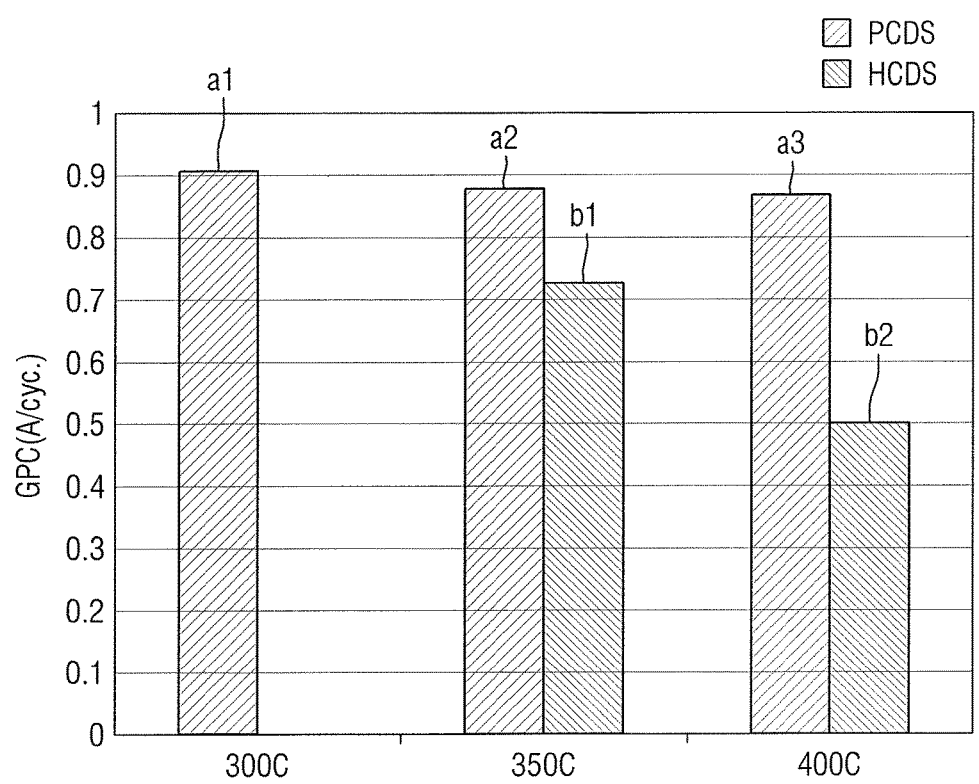
FIG. 2 illustrates a graph for explaining an experimental example of the formation of a silicon nitride layer according to an exemplary embodiment.

FIG. 2 illustrates a graph showing experimental examples of the formation of a silicon nitride layer according to some exemplary embodiments.

Experimental Example—Measurement of GPC Rate According to Processing Temperature for PCDS and HCDS Experiments were conducted as experimental examples and comparative examples, respectively.

In the experimental examples, a silicon nitride layer was formed by an ALD method using PCDS. In the comparative examples, a silicon nitride layer was formed by an ALD method using HCDS.

Referring to FIG. 2, silicon nitride layers were formed at temperatures of 300° C., 350° C., and 400° C., respectively, by using PCDS according to the experimental examples, and silicon nitrides layer were formed at temperatures of 300° C., 350° C., and 400° C., respectively, by using HCDS according to the comparative examples.

Bars a1, a2, and a3 represent GPC rate measurements obtained when forming a silicon nitride layer at temperatures of 300° C., 350° C., and 400° C., respectively, by using PCDS according to the experimental example. Bars b1, b2, and b3 represent GPC rate measurements obtained when forming a silicon nitride layer at temperatures of 300° C., 350° C., and 400° C., respectively, by using HCDS according to the comparative example.

Referring to bars a2 and b1, in the case of forming a silicon nitride layer at a temperature of 350° C., the GPC rate was shown to be higher when using PCDS according to the experimental example than when using HCDS according to the comparative example.

Referring to bars a3 and b2, in the case of forming a silicon nitride layer at a temperature of 400° C., the GPC rate was also shown to be higher when using PCDS according to the experimental example than when using HCDS according to the comparative example.

Referring to bar a1, in the case of forming a silicon nitride layer at a temperature of 300° C., no silicon nitride layer is formed when using HCDS according to the comparative example, but when using PCDS according to the experimental example, a GPC rate of 0.9 Å/cyc or higher is obtained.

From the above, it can be seen that a GPC rate of 0.8 Å/cyc or higher may be achieved when forming a silicon nitride layer using PCDS according to the experimental example. Also, a GPC rate is shown to be generally improved when using PCDS, compared to when using HCDS, and a silicon nitride layer with an excellent step coverage can be formed even in a low-temperature process performed at a relatively low temperature of 300° C. or greater but less than 350° C.

The fabrication of a semiconductor device using a method of forming a silicon nitride layer according to some exemplary embodiments will hereinafter be described.

A method for fabricating a semiconductor device according to an exemplary embodiment will hereinafter be described with reference to FIG. 3 to FIG. 5.

Figure 3:
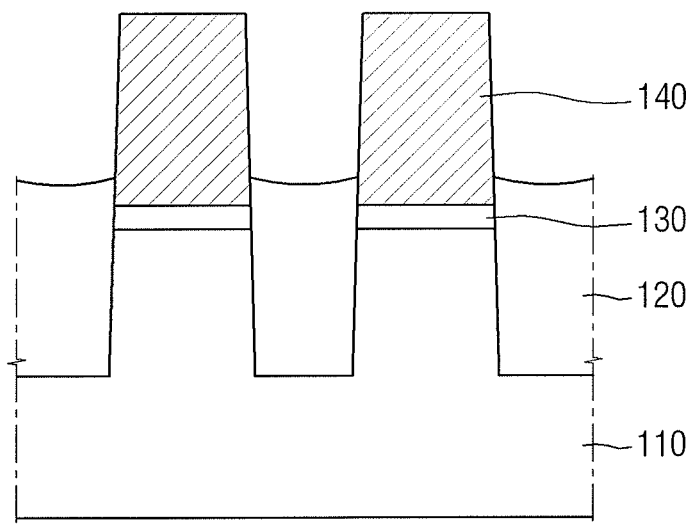
FIG. 3 to FIG. 5 illustrate schematic views illustrating stages of a method for fabricating a semiconductor device according to an exemplary embodiment.
Figure 4:
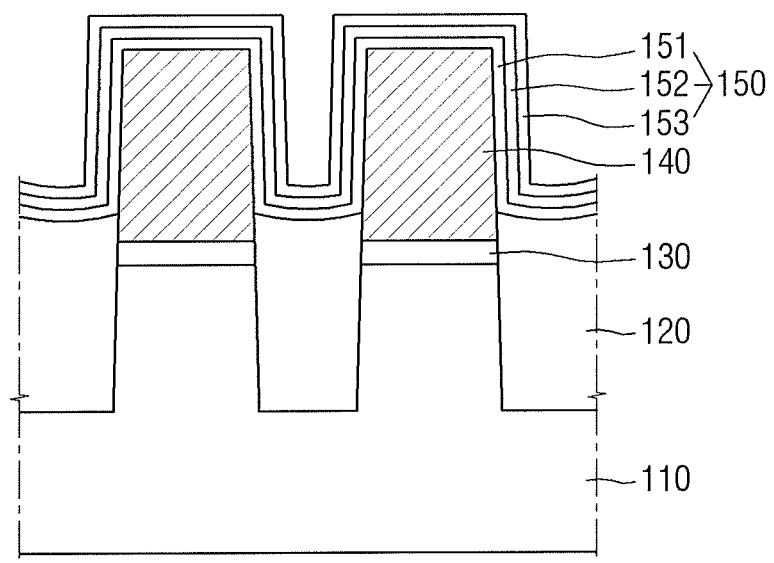
Figure 5:
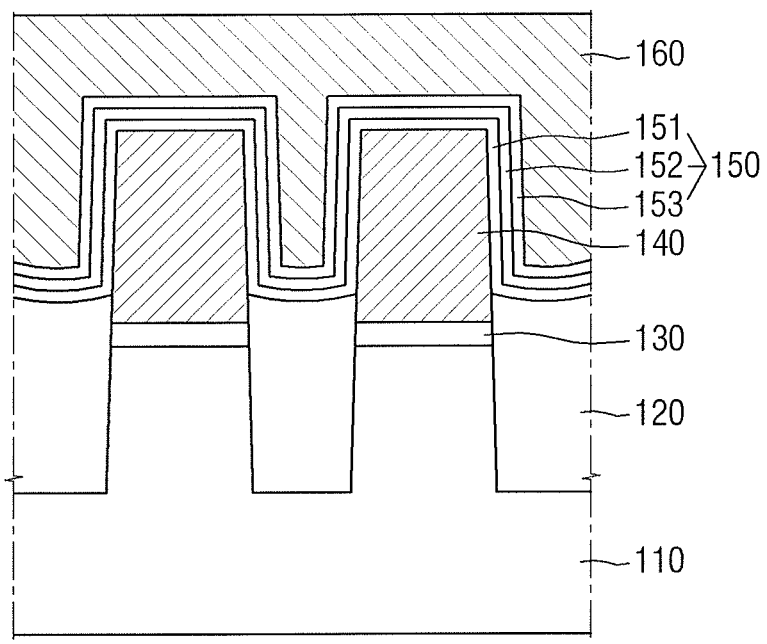

FIG. 3 to FIG. 5 illustrate schematic views depicting stages of a method for fabricating a semiconductor device according to an exemplary embodiment. For example, FIG. 3 to FIG. 5 illustrate steps of a method for fabricating a flash memory device.

Referring to FIG. 3, a tunnel dielectric layer 130 and a charge storage layer 140 may be sequentially formed on a substrate 110. The tunnel dielectric layer 130 may provide an energy band gap for the tunneling of electric charges.

The tunnel dielectric layer 130 may be formed of suitable materials in consideration of dielectric constant and energy band gap properties. The tunnel dielectric layer 130 may include, for example, silicon oxide, silicon nitride, or a high-k material.

The high-k material may include a metal oxide such as, for example, hafnium oxide, aluminum oxide, hafnium aluminum oxide, or zirconium oxide.

The charge storage layer 140 may store electric charges. When a flash memory device to be fabricated is of a floating gate type, the charge storage layer 140 may be formed of a conductive material such as polysilicon. When the flash memory device to be fabricated is of a charge trap type, the charge storage layer 140 may be formed of silicon nitride, hafnium oxide, zirconium oxide, tantalum oxide, hafnium oxynitride, hafnium silicon oxide, tungsten-doped aluminum oxide, or nanodots.

The tunnel dielectric layer 130 and the charge storage layer 140 may be formed in a suitable manner. For example, the formation of the tunnel dielectric layer 130 and the charge storage layer 140 may include sequentially forming a pre-tunnel dielectric layer, a pre-charge storage layer, and a mask layer on the substrate 110, forming an isolation layer 120 by patterning the pre-tunnel layer, the pre-charge storage layer, and the mask layer, and removing the mask layer.

Referring to FIG. 4 and FIG. 5, a dielectric layer structure 150 that includes a first dielectric layer 151 that is formed of silicon oxide, a second dielectric layer 152 that is formed of a material other than silicon oxide, and a third dielectric layer 153 that is formed of silicon oxide may be formed on the charge storage layer 140 using the ALD method as described herein. When the flash memory device to be fabricated is a floating gate type, the dielectric layer structure 150 may be an inter-gate dielectric layer. When the flash memory device to be fabricated is a charge trap type, the dielectric layer structure 150 may be a blocking dielectric layer.

The in-situ formation of the dielectric layer structure 150 having a silicon nitride layer as the second dielectric layer 152 will hereinafter be described.

A substrate 110 with a height difference and having the charge storage layer 140 formed thereon may be placed in a chamber. Thereafter, a first dielectric layer 151 including silicon oxide may be formed.

For example, the temperature and pressure may be appropriately controlled, and a first gas including a silicon precursor may be fed into the chamber. Then, the silicon precursor may be absorbed onto the first dielectric layer 151. For example, one of PCDS and DPDC may be used as the silicon precursor.

Thereafter, a second dielectric layer 152 having an atomic-layer thickness and including silicon nitride may be formed on the first dielectric layer 151 by sequentially feeding a first purge gas, a second gas, and a second purge gas.

By repeatedly performing forming the second dielectric layer 152 having an atomic-layer thickness, the second dielectric layer 152 having a desired thickness may be formed on the first dielectric layer 151 as a silicon nitride layer.

Thereafter, a third dielectric layer 153 including silicon oxide may be formed on the second dielectric layer 152.

The dielectric layer structure 150 may have an excellent step coverage and thus may be conformally formed in spaces between parts of the charge storage layer 140 having an aspect ratio of, for example, 10 or greater, without leaving any voids. When the first, second, and third dielectric layers 151, 152, and 153 are formed in situ, the amount of time that it takes to form the dielectric layer structure 150 may be reduced, and the formation of the dielectric layer structure 150 may be simplified.

Thereafter, a control gate 160 may be formed on the dielectric layer structure 150. For example, the control gate 160 may be formed of polysilicon or a metal electrode material such as TaN, TiN, WN, W, or a combination thereof.

A method for fabricating a semiconductor device according to another exemplary embodiment will hereinafter be described with reference to FIG. 6 to FIG. 8.

Figure 6:
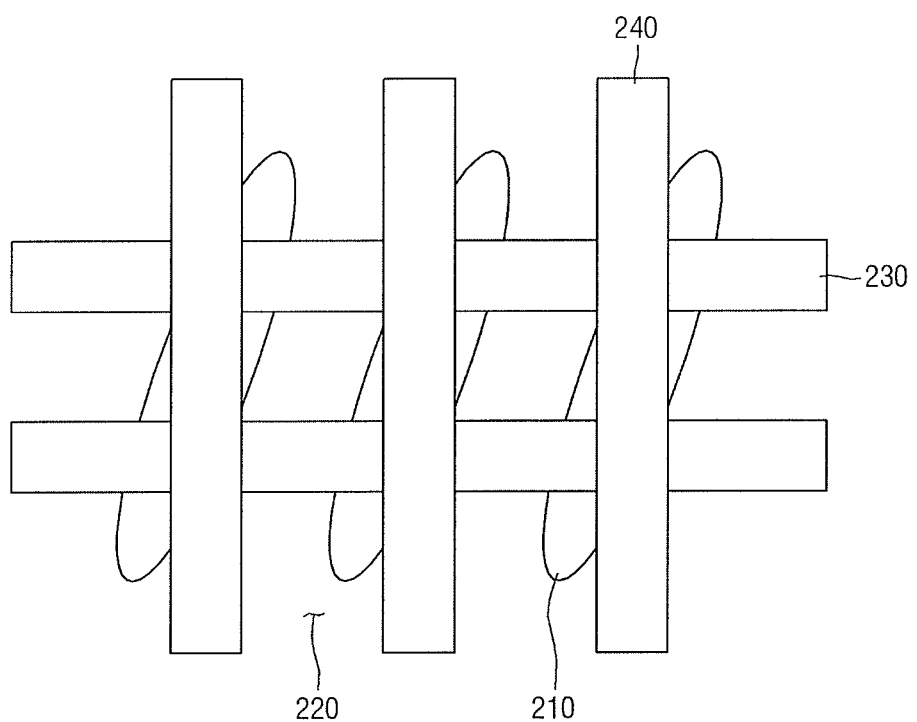
FIG. 6 to FIG. 8 illustrate schematic views illustrating stages of a method for fabricating a semiconductor device according to an exemplary embodiment.
Figure 7:
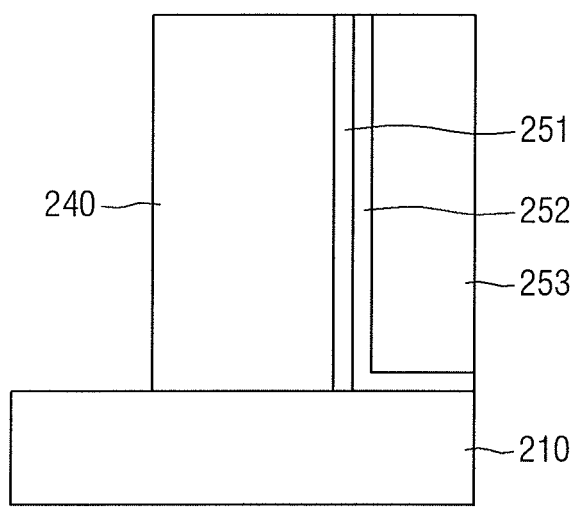
Figure 8:
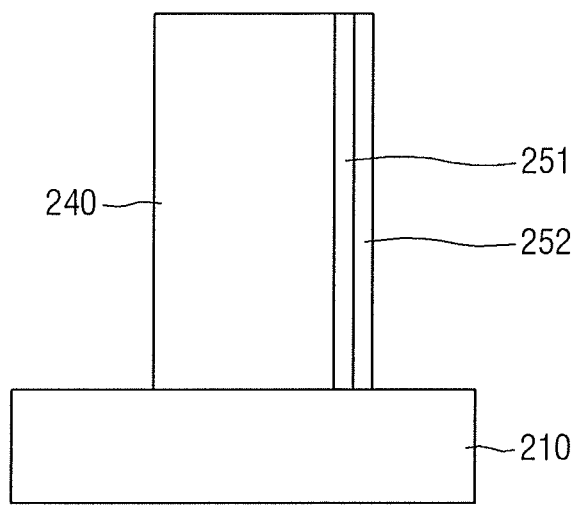

FIG. 6 to FIG. 8 illustrate schematic views depicting stages of a method for fabricating a semiconductor device according to another exemplary embodiment. For example, FIG. 6 to FIG. 8 illustrate steps of a method for fabricating a dynamic random access memory (DRAM) cell semiconductor device.

Referring to FIG. 6, which is a layout view of a DRAM cell region, gates 230 extend across active regions 210 of a substrate along a horizontal direction, and global bit lines (GBLs) 240 extend across the active regions 210 along a vertical direction. A part of the substrate other than the active regions 210 is an isolation region 220.

Referring to FIG. 7 and FIG. 8, which illustrate a memory cell region, a GBL 240 is formed on an active region 210 of a substrate. Thereafter, a first dielectric layer 251 including silicon oxide is formed on the sidewall of the GLB 240. The first dielectric layer 251 may perform the functions of a spacer.

Thereafter, a second dielectric layer 252 including silicon nitride is formed on the first dielectric layer 251. The second dielectric layer 252 may be formed using the ALD method as described above.

For example, the temperature and pressure in a chamber may be adjusted, and a first gas including a silicon precursor may be fed into the chamber. The silicon precursor may be adsorbed onto the first dielectric layer 251. PCDS or DPDC may be used as the silicon precursor.

Thereafter, a second dielectric layer 252 having an atomic-layer thickness and including silicon nitride may be formed on the first dielectric layer 251 by sequentially feeding a first purge gas, a second gas, and a second purge gas. The reaction between the second gas and the silicon precursor may be reacted under thermal conditions or plasma conditions.

By repeatedly performing the step of forming the second dielectric layer 252 having an atomic-layer thickness, a second dielectric layer 252 having a desired thickness may be formed on the first dielectric layer 251 as a silicon nitride layer.

Thereafter, a third dielectric layer 253 including silicon oxide may be formed on the second dielectric layer 252.

Since there is no need to form an impurity layer in the cell region, a photoresist pattern may be formed to cover the cell region. The photoresist pattern and the third dielectric layer 253 may be removed, and a nitride layer spacer may be formed by performing an anisotropic etching process on the second dielectric layer 252. Thereafter, a part of the second dielectric layer 252 in contact with the active region 210 of the substrate may be removed.

A method for fabricating a semiconductor device according to another exemplary embodiment will hereinafter be described with reference to FIG. 9 to FIG. 12.

FIG. 9 to FIG. 12 illustrate schematic views depicting steps of a method for fabricating a semiconductor device according to another exemplary embodiment. For example, FIG. 9 to FIG. 12 illustrate stages of a method for fabricating a semiconductor device having a stacked nanosheet transistor structure.

Figure 9:
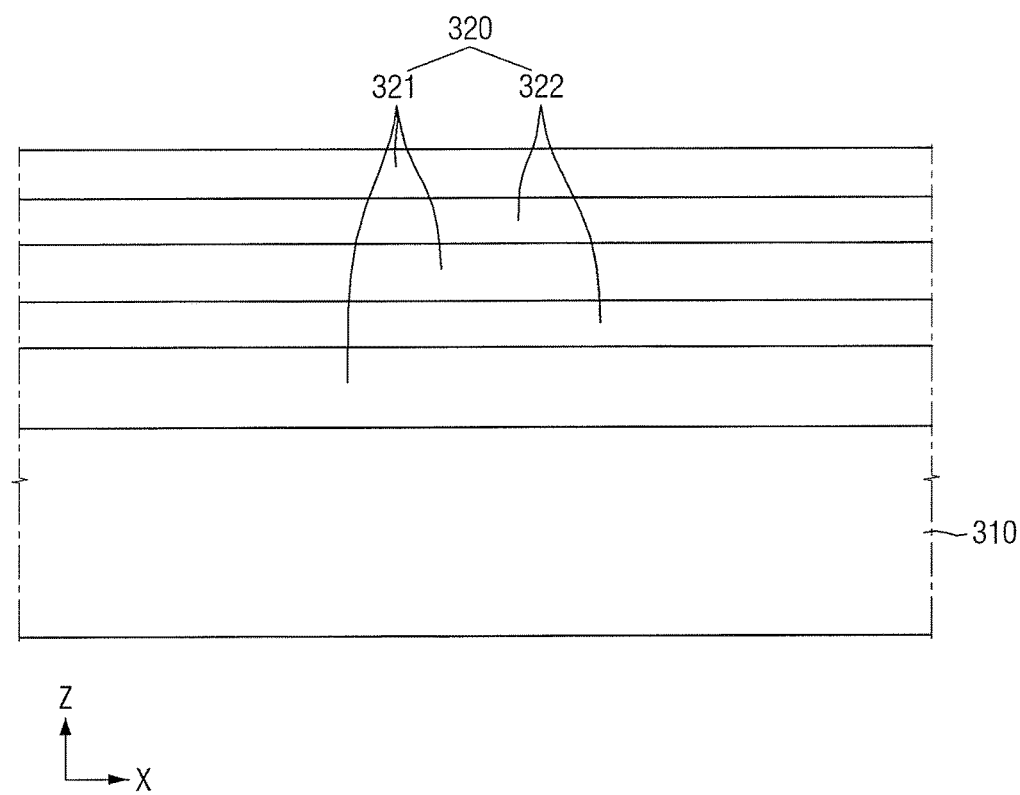
FIG. 9 to FIG. 12 illustrate schematic views illustrating stages of a method for fabricating a semiconductor device according to an exemplary embodiment.

Referring to FIG. 9, a stack structure 320 in which a plurality of sacrificial layers 321 and a plurality of semiconductor layers 322 are alternately stacked may be formed on a substrate 310.

The lowermost sacrificial layer 321, which is in contact with the substrate 310, may be bonded onto the substrate 310 through, for example, wafer bonding.

The semiconductor layers 322 and the non-lowermost sacrificial layers 321 may be alternately formed on the lowermost sacrificial layer 321 through, for example, epitaxial growth. The uppermost layer of the stack structure 320 may be, for example, a sacrificial layer 321.

The sacrificial layers 321 and the semiconductor layers 322 may include different materials from each other. The sacrificial layers 321 may include a material having a different etching selectivity from that of the semiconductor layers 322. The sacrificial layers 321 may include, for example, SiGe or Ge. The semiconductor layers 322 may include, for example, Si and a III-V group compound semiconductor.

Figure 10:
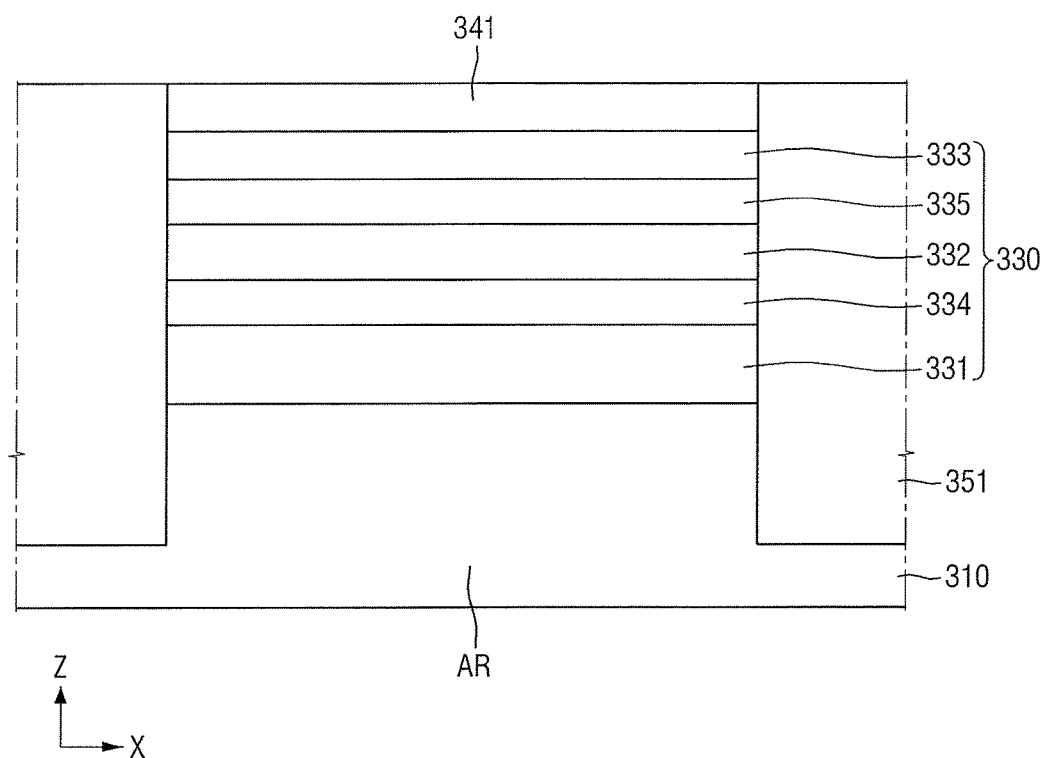

Thereafter, referring to FIG. 10, a first mask pattern 341, which extends in a first direction X, may be formed on the stack structure 320.

The first mask pattern 341 may be formed of a material including, for example, at least one of a silicon oxide layer, a silicon nitride layer, or a silicon oxynitride layer. When the first mask pattern 341 includes a silicon nitride layer, the first mask pattern 341 may be formed by the ALD method as describe above.

For example, the temperature and pressure in a chamber may be adjusted, and a first gas including a silicon precursor may be fed into the chamber. Then, the silicon precursor may be adsorbed onto the stack structure 320. PCDS or DPDC, as examples, may be used as the silicon precursor.

Thereafter, a first mask pattern 341 having an atomic-layer thickness and including silicon nitride may be formed on the stack structure 320 by sequentially feeding a first purge gas, a second gas, and a second purge gas. By repeatedly performing forming the first mask pattern 341 having an atomic-layer thickness, the first mask pattern 341 having a desired thickness may be formed on the stack structure 320 as a silicon nitride layer.

As illustrated in FIG. 10, a semiconductor pattern structure 330 may be formed by etching the stack structure 320 using the first mask pattern 341 as a mask. For example, the semiconductor pattern structure 330 may be formed by etching the stack structure 320 until the top surface of the substrate 310 is exposed.

The semiconductor pattern structure 330 may extend long in the first direction X. The semiconductor pattern structure 330 may include a plurality of sacrificial layers and a plurality of semiconductor layers that are alternately stacked on the substrate 310.

For example, the semiconductor pattern structure 330 may include a first sacrificial layer 331, which is formed on the substrate 310, a first semiconductor layer 334, which is formed on the first sacrificial layer 331, a second sacrificial layer 332, which is formed on the first semiconductor layer 334, a second semiconductor layer 335, which is formed on the second sacrificial layer 332, and a third sacrificial layer 333, which is formed on the second semiconductor layer 335.

During the etching of the stack structure 330, part of the substrate 310 may also be etched, thereby forming an active region AR. Thereafter, an interlayer dielectric layer may be formed to cover the substrate 310 and the first mask pattern 341. The interlayer dielectric layer may then be subjected to a planarization process until the top surface of the first mask pattern 341 is exposed. As a result, an interlayer dielectric layer 351 of FIG. 10 may be obtained.

Thereafter, the first mask pattern 341 may be removed from the semiconductor pattern structure 330.

Figure 11:
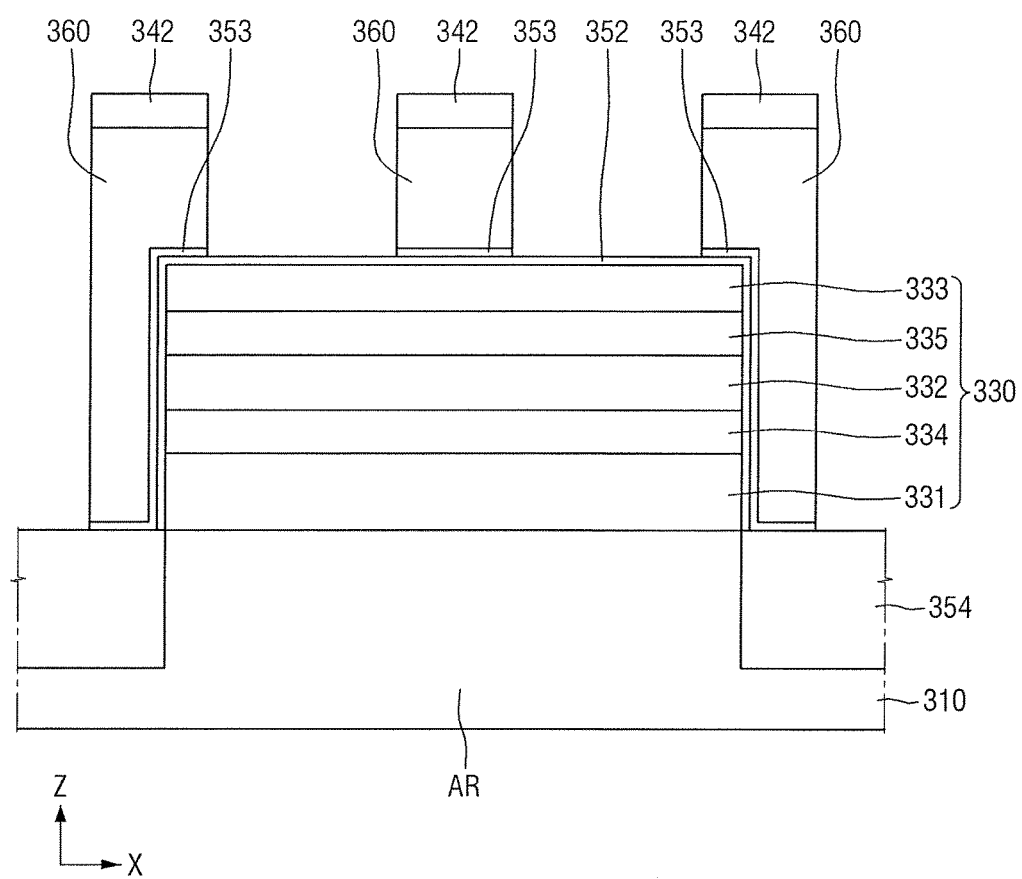

Referring to FIG. 11, by performing an etching process using second mask patterns 342, gate insulating layers 353 and sacrificial gates 360, which both extend in a third direction that is perpendicular to the first direction X and a second direction Z, may be formed to intersect the semiconductor pattern structure 330.

The second mask patterns 342 may be formed of a material including, for example, at least one of a silicon oxide layer, a silicon nitride layer, or a silicon oxynitride layer. When the second mask patterns 342 include a silicon nitride layer, the second mask patterns 342 may be formed by the ALD method described above.

The sacrificial gates 360 may be formed on the semiconductor pattern structure 330. Also, the gate insulating layers 353 may be formed on the sides and the top surface of an insulating layer 352 and on the top surface of a field insulating layer 354.

The insulating layer 352 may be formed between the semiconductor pattern structure 330 and the gate insulating layers 353 to cover the semiconductor pattern structure 330. The insulating layer 352 may be, for example, an oxide layer, for example, a layer comprising $SiO_2$.

For example, the gate insulating layers 353 may be silicon oxide layers, and the sacrificial gates 360 may include polysilicon or amorphous silicon.

Figure 12:
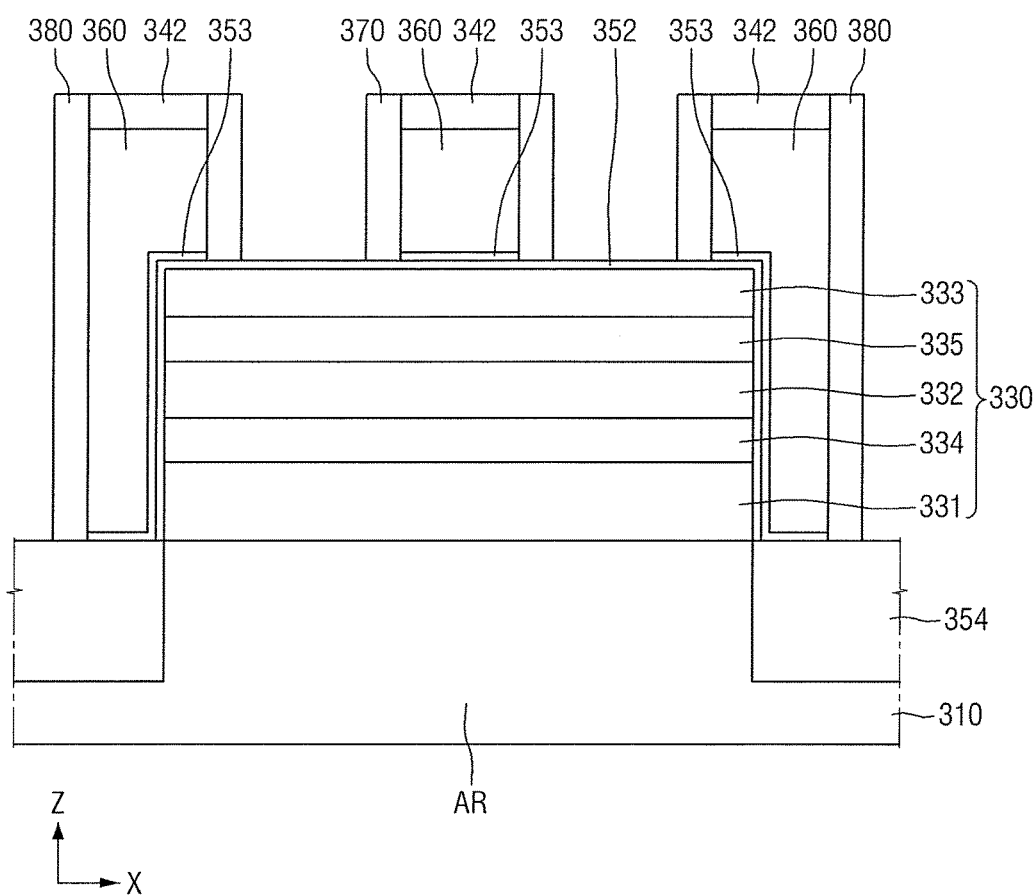

Referring to FIG. 12, gate spacers 370 and dummy gate spacers 380 may be formed on the sidewalls of the sacrificial gates 360.

For example, a spacer layer may be formed on the substrate 310 to cover the sacrificial gates 360 and the semiconductor pattern structure 330. When the spacer layer includes silicon nitride, the spacer layer may be formed by the ALD method described above.

The temperature and pressure in a chamber may be adjusted, and a first gas including a silicon precursor may be fed into a chamber. Then, the silicon precursor may be adsorbed onto the sacrificial gates 360 and the semiconductor pattern structure 330. PCDS or DPDC, for example, may be used as the silicon precursor.

Thereafter, as described above, a spacer layer having an atomic-layer thickness and including silicon nitride may be formed on the sacrificial gates 360 and the semiconductor pattern structure 330 by sequentially feeding a first purge gas, a second gas, and a second purge gas.

By repeatedly performing forming the spacer layer having an atomic-layer thickness, a spacer layer having a desired thickness may be formed on the sacrificial gates 360 and the semiconductor pattern structure 330 as a silicon nitride layer.

Thereafter, by etching back the spacer layer, the gate spacers 370 and the dummy gate spacers 380 may be formed on the sidewalls of the sacrificial gates 360.

A method for fabricating a semiconductor device according to another exemplary embodiment will hereinafter be described with reference to FIG. 13 and FIG. 14.

Figure 13:
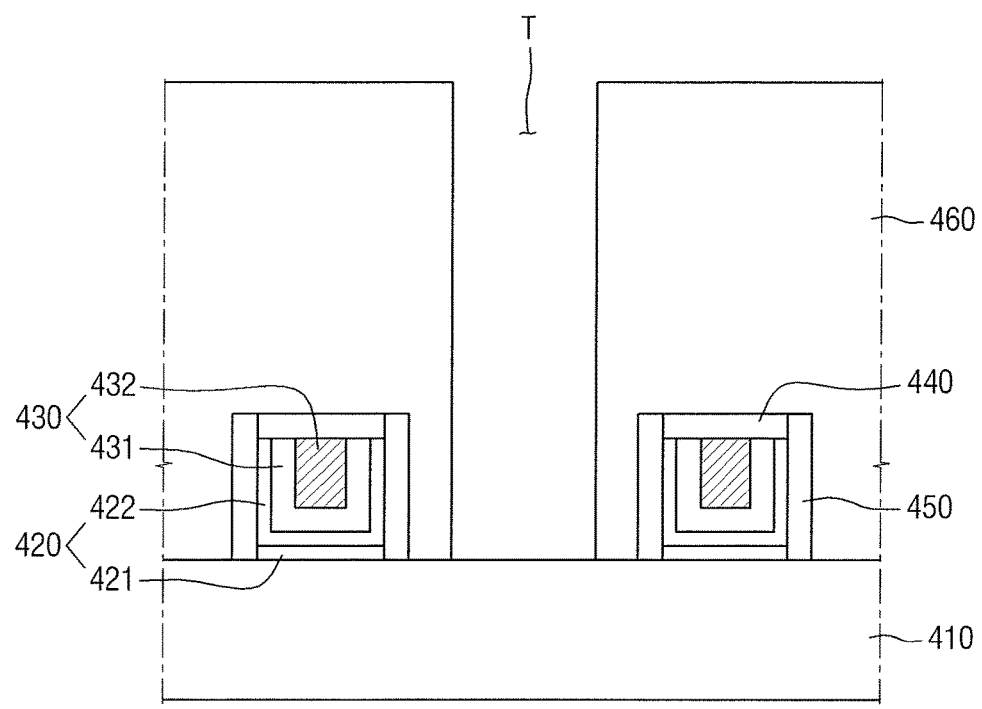
FIG. 13 and FIG. 14 illustrate schematic views illustrating steps of a method for fabricating a semiconductor device according to an exemplary embodiment.
Figure 14:
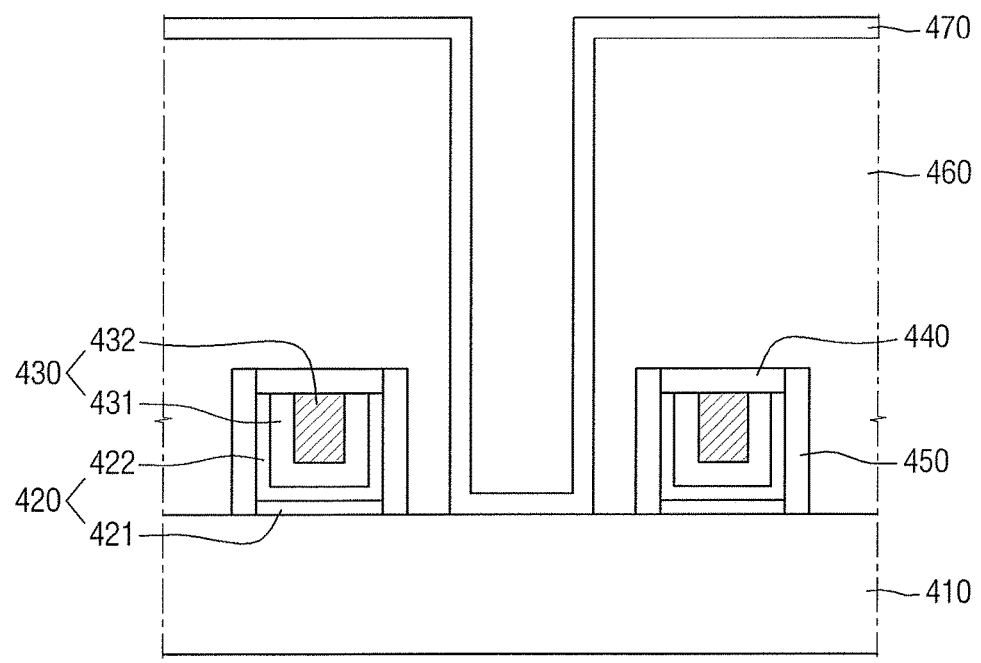

FIG. 13 and FIG. 14 illustrate schematic views depicting stages of a method for fabricating a semiconductor device according to another exemplary embodiment. For example, FIG. 13 and FIG. 14 illustrate stages of a method for fabricating a semiconductor device having spacers formed in the contacts thereof.

Referring to FIG. 13, first and second gate patterns may be formed on a substrate 410 to be spaced apart from each other. The first and second gate patterns may have substantially the same elements.

Each of the first and second gate patterns may include gate spacers 450, an insulating layer pattern 420, a gate electrode pattern 430, and a capping pattern 440.

The insulating layer pattern 420 may include an interface layer 421 and a gate insulating layer 422.

The interface layer 421 may help to prevent a poor interface from existing between the substrate 410 and the gate insulating layer 422.

The interface layer 421 may include a low-k material layer having a dielectric constant (k) of 9 or less. The interface layer 421 may include, for example, a silicon oxide layer having a dielectric constant (k) of 4 or a silicon oxynitride layer having a dielectric constant (k) of about 4 to 8, depending on the contents of oxygen and nitrogen atoms in the silicon oxynitride layer.

The interface layer 421 may be formed by, for example, chemical oxidation, ultraviolet (UV) oxidation, or dual plasma oxidation.

The gate insulating layer 422 may be formed on the interface layer 421. When the interface layer 421 is not provided, the gate insulating layer 422 may be formed on the substrate 410.

The gate insulating layer 422 may include a high-k material. The gate insulating layer 422 may include, for example, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, as examples.

The gate insulating layer 422 may be formed to an appropriate thickness depending on the type of a semiconductor device to be fabricated. For example, when the gate insulating layer 422 includes $HfO_2$, the gate insulating layer 422 may be formed to a thickness of about 50 Å (for example, to a thickness of about 5 Å to 50 Å).

The gate electrode pattern 430 may include a work function adjustment layer 431 and a gate metal 432.

The work function adjustment layer 431 may be formed on the gate insulating layer 422. The work function adjustment layer 431 may be formed to be in contact with the gate insulating layer 422. The work function adjustment layer 431 may be used to adjust a work function.

The work function adjustment layer 431 may include, for example, a metal nitride. The material of the work function adjustment layer 431 may vary depending on the type of the semiconductor device to be fabricated. When the work function adjustment layer 431 is a p-type work function adjustment layer, the work function adjustment layer 431 may include, for example, at least one of TiN, WN, TaN, Ru, or a combination thereof. When the work function adjustment layer 431 is an n-type work function adjustment layer, the work function adjustment layer 431 may include, for example, at least one of Ti, Ag, Al, TiAl, TiAlN, TiAlC, TaC, TaCN, TaSiN, Mn, Zr, or a combination thereof.

When the work function adjustment layer 431 is a p-type work function adjustment layer, the work function adjustment layer 431 may be formed as a single layer including TiN and a double layer include a TiN lower layer and a TaN upper layer.

The gate metal 432 may be formed on the work function adjustment layer 431. The gate metal 432 may be formed to be in contact with the work function adjustment layer 431. For example, the gate metal 432 may be formed to fill the space formed by the work function adjustment layer 431. The gate metal 432 may include a conductive material such as, for example, W or Al.

The capping pattern 440 may be formed on the gate metal 432. The capping pattern 440 may be formed to be in contact with the gate metal 432. The capping pattern 440 may include, for example, at least one of silicon nitride (SiN), silicon oxynitride (SiON), silicon oxide ($SiO_2$), silicon carbonitride (SiCN), silicon oxycarbonitride (SiOCN), or a combination thereof.

An interlayer dielectric layer 460 may be formed on the substrate 410 to cover the first and second gate patterns. The interlayer dielectric layer 460 may include, for example, at least one of a low-k material, an oxide layer, a nitride layer, or an oxynitride layer. The low-k material may include, for example, flowable oxide (FOX), tonen silazene (TOSZ), undoped silicate glass (USG), borosilicate glass (BSG), phosphosilicate glass (PSG), borophosphosilicate glass (BPSG), plasma enhanced tetra ethyl ortho silicate (PE-TEOS), fluoride silicate glass (FSG), carbon doped silicon oxide (CDO), Xerogel, Aerogel, amorphous fluorinated carbon, organo silicate glass (OSG), parylene, bis-benzocyclobutene (BCB), SiLK, polyimide, a porous polymeric material, or a combination thereof.

After the formation of the first and second gate patterns on the substrate 410, the interlayer dielectric layer 460 may be formed to cover the first and second gate patterns.

Thereafter, a trench T may be formed in the interlayer dielectric layer 460 to expose a part of the substrate 410 between the first and second gate patterns. The trench T may be formed in the interlayer dielectric layer 460 by removing part of the interlayer dielectric layer 460 using, for example, a dry etching process, a wet etching process, or a combination thereof.

Referring to FIG. 14, a spacer material 470 may be conformally formed on the sidewalls of the trench T. When the spacer material 470 includes a silicon nitride layer, the spacer material 470 may be formed by the ALD method according to the present disclosure.

For example, the temperature and pressure in a chamber may be adjusted, and a first gas including a silicon precursor may be fed into a chamber. Then, the silicon precursor may be adsorbed onto the sidewalls and the bottom of the trench T. As described above, PCDS or DPDC, for example, may be used as the silicon precursor.

A spacer material 470 having an atomic-layer thickness and including silicon nitride may be formed on the sidewalls and the bottom of the trench T by sequentially feeding a first purge gas, a second gas, and a second purge gas as described above.

By repeatedly performing forming the spacer material 470 having an atomic-layer thickness, a contact spacer having a desired thickness may be formed on the sidewalls and the bottom of the trench T as a silicon nitride layer.

By way of summation and review, as the integration density of semiconductor devices increases, it becomes more and more difficult to fabricate semiconductor devices, and particularly, to form thin films for use in the fabrication of semiconductor devices, such as, for example, silicon nitride layers, on a substrate to have step coverage. In the case of forming a silicon nitride layer through atomic layer deposition (ALD) using an organic silicon precursor such as bis(tertiary-butylamine)silane (BTBAS), improved step coverage may be provided, but the quality of the silicon nitride layer may deteriorate due to the carbon (C) and nitrogen (N) components included in the organic silicon precursor.

Methods of fabricating a semiconductor device according to exemplary embodiments can form a dielectric layer using a silicon precursor including PCDS and DPDC or using an ALD method. Thus, excellent step coverage may be obtained, compared to a case in which existing silicon precursors are used. Accordingly, a silicon nitride layer can be conformally formed on a structure with a large height difference or a high aspect ratio without leaving any voids.

Exemplary embodiments also provide a method for fabricating a semiconductor device that is capable of improving a growth per cycle (GPC) rate through atomic layer deposition (ALD) and forming a silicon nitride layer having an excellent step coverage even in a low-temperature process. As discussed above with the experimental and comparative examples, the GPC rate may be improved, compared to a case in which existing silicon precursors are used, and a silicon nitride layer having an excellent step coverage may be formed even in a low-temperature process performed at a relatively low temperature of 300° C. or greater and less than 350° C.

The ALD method according to the present disclosure can be used in various other methods of fabricating a semiconductor device that conformally form a dielectric layer comprising silicon nitride through ALD.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A method for fabricating a semiconductor device, the method comprising:
   forming a structure with a height difference on a substrate; and
   forming a dielectric layer structure on the structure with the height difference using an atomic layer deposition (ALD) method,
   wherein
   forming the dielectric layer structure includes forming a first dielectric layer including silicon nitride on the structure with the height difference, wherein forming the first dielectric layer includes feeding a first gas including pentachlorodisilane (PCDS) or diisopropylamine pentachlorodisilane (DPDC) as a silicon precursor into a chamber including the substrate to form a silicon precursor layer having atomic layer thickness on the structure with the height difference, and feeding a second gas including nitrogen into a chamber including the substrate, such that the second gas reacts with the silicon precursor layer to form a silicon nitride layer having an atomic layer thickness on the structure with the height difference.

2. The method as claimed in claim 1, wherein forming the first dielectric layer includes purging an unreacted portion of the first gas by feeding a first purge gas into the chamber and purging an unreacted portion of the second gas by feeding a second purge gas into the chamber.

3. The method as claimed in claim 1, wherein forming the first dielectric layer includes depositing the silicon precursor at a growth per cycle (GPC) rate of 0.8 Å/cyc or higher at a temperature of 300° C. to 400° C.

4. The method as claimed in claim 3, wherein forming the first dielectric layer includes depositing the silicon precursor at a GPC rate of 0.9 Å/cyc or higher at a temperature of 300° C.

5. The method as claimed in claim 1, wherein forming the dielectric layer structure further includes forming a second dielectric layer including silicon oxide between the substrate and the first dielectric layer.

6. The method as claimed in claim 5, wherein:
   the structure having the height difference includes global bit lines (GBLs), and
   forming the dielectric layer structure further includes forming the second dielectric layer on the GBLs, and forming the first dielectric layer on the second dielectric layer.

7. The method as claimed in claim 5, wherein:
   the structure having the height difference includes a charge storage layer, and
   forming the dielectric layer structure further includes forming the second dielectric layer on the charge storage layer, and forming the first dielectric layer on the second dielectric layer.

8. The method as claimed in claim 1, wherein:
   the structure having the height difference includes a gate, and
   forming the first dielectric layer further includes forming the first dielectric layer on a sidewall of the gate.

9. The method as claimed in claim 1, wherein the second gas includes at least one of nitrogen ($N_2$) and ammonia ($NH_3$).

10. A method for fabricating a semiconductor device, the method comprising:
    forming a structure on a substrate; and
    forming a silicon nitride layer on the structure inside a chamber using an atomic layer deposition (ALD) method,
    wherein forming the silicon nitride layer includes feeding a first gas including one of pentachlorodisilane (PCDS) and diisopropylaminopentachlorodisilane (DPDC) as a silicon precursor into the chamber to form a silicon precursor layer having an atomic layer thickness on the structure, purging an unreacted portion of the first gas by feeding a first purge gas into the chamber, feeding a second gas including nitrogen into the chamber such that the second gas reacts with the silicon precursor layer to form a silicon nitride film having an atomic layer thickness on the structure, and purging an unreacted portion of the second gas by feeding a second purge gas into the chamber.

11. The method as claimed in claim 10, wherein forming the silicon nitride layer includes forming first and second gate patterns on the substrate, forming an insulating layer pattern to cover the first and second gate patterns, forming a trench in the insulating layer pattern between the first and second gate patterns, and forming the silicon nitride layer on a sidewall of the trench.

12. The method as claimed in claim 10, wherein the structure is a trench having an aspect ratio of 10 or greater.

13. The method as claimed in claim 10, further comprising-etching the structure using the silicon nitride layer as a mask layer.

14. The method as claimed in claim 10, further comprising depositing the silicon precursor at a temperature that is 300° C. or greater and less than 350° C.

15. The method as claimed in claim 10, further comprising increasing a thickness of the silicon nitride layer by repeatedly performing forming the silicon nitride layer.

16. A method of forming a dielectric layer on a target object by atomic layer deposition, the target object containing at least one structural feature having a sidewall, the method comprising:
    feeding a first gas including pentachlorodisilane (PCDS) or diisopropylamine pentachlorodisilane (DPDC) into a chamber including the target object to form a silicon precursor layer having an atomic layer thickness on the target object;
    feeding a first purge gas into the chamber to purge an unreacted portion of the first gas from the chamber;
    feeding a second gas into the chamber, the second gas including nitrogen, such that the second gas reacts with the silicon precursor layer to form a silicon nitride layer having an atomic layer thickness on the target object;
    feeding a second purge gas into the chamber to purge an unreacted portion of the second gas from the chamber; and
    repeating feeding the first gas, feeding the first purge gas, feeding the second gas and feeding the second purge gas to form the dielectric layer to include a silicon nitride layer having greater than an atomic layer thickness.

17. The method as claimed in claim 16, further including at least one of:
    forming a silicon oxide layer on the target object before forming the silicon nitride layer having an atomic layer thickness, or
    forming a silicon oxide layer on the formed dielectric layer including the silicon nitride layer having greater than an atomic layer thickness.

18. The method as claimed in claim 16, wherein the structural feature having a sidewall is a trench or recess having an aspect ratio of 10 or greater.

19. The method as claimed in claim 16, wherein forming the dielectric layer is carried out in the chamber at a temperature of 300° C. to 400° C.

20. The method as claimed in claim 16, further including performing a thermal treatment on the formed dielectric layer at a temperature of about 850° C. to about 1,050° C.

* * * * *